(12) United States Patent
Ben-Bassat et al.

(10) Patent No.: US 12,429,829 B2
(45) Date of Patent: Sep. 30, 2025

(54) DIGITAL-TO-TIME CONVERTER (DTC) NON-LINEARITY PREDISTORTION

(71) Applicant: Intel Corporation, Santa Clara, CA (US)

(72) Inventors: Assaf Ben-Bassat, Haifa (IL); Ofir Degani, Haifa (IL); Elan Banin, Raanana (IL); Shahar Gross, Nes-Tziona (IL); Phillip Skliar, Holon (IL)

(73) Assignee: Intel Corporation, Santa Clara, CA (US)

( * ) Notice: Subject to any disclaimer, the term of this patent is extended or adjusted under 35 U.S.C. 154(b) by 752 days.

(21) Appl. No.: 17/556,457

(22) Filed: Dec. 20, 2021

(65) Prior Publication Data

US 2023/0195045 A1  Jun. 22, 2023

(51) Int. Cl.
*H03M 1/50* (2006.01)
*G04F 10/00* (2006.01)
*H03M 1/84* (2006.01)

(52) U.S. Cl.
CPC .......... *G04F 10/005* (2013.01); *H03M 1/84* (2013.01)

(58) Field of Classification Search
CPC .............................. G04F 10/005; H03M 1/84
USPC .................. 341/144, 152, 111, 166
See application file for complete search history.

(56) References Cited

U.S. PATENT DOCUMENTS

| 9,520,890 B1 | 12/2016 | Ben-Bassat et al. |
| 10,459,407 B1 * | 10/2019 | Degani ............... H03M 1/1009 |
| 2015/0049840 A1 * | 2/2015 | Banin ................. H04B 1/0475 341/145 |
| 2017/0085365 A1 | 3/2017 | Ravi et al. |

FOREIGN PATENT DOCUMENTS

WO WO-2020005441 A1 1/2020

OTHER PUBLICATIONS

"European Application Serial No. 22213204.5, Extended European Search Report mailed May 19, 2023", 9 pgs.
"European Application Serial No. 22213204.5, Response filed Nov. 30, 2023 to Extended European Search Report mailed May 19, 2023", 15 pgs.

* cited by examiner

Primary Examiner — Peguy Jean Pierre
(74) Attorney, Agent, or Firm — Schwegman Lundberg & Woessner, P.A.

(57) ABSTRACT

A method for compensating signal nonlinearities includes generating a local oscillator (LO) signal and performing phase modulation of the LO signal to generate a phase-modulated LO signal. The phase modulation is based on applying at least one digital-to-time converter (DTC) code of a plurality of DTC codes to a rising edge signal portion and a falling edge signal portion associated with the LO signal. Nonlinearities associated with the rising edge signal portion and the falling edge signal portion are determined. The at least one DTC code is adjusted based on the nonlinearities.

20 Claims, 8 Drawing Sheets

DIGITAL-TO-TIME CONVERTER (DTC) NON-LINEARITY PREDISTORTION

TECHNICAL FIELD

Various embodiments generally may relate to the field of radio frequency (RF) signal communication by a wireless device, including digital-to-time converter (DTC) non-linearity predistortion circuitry.

BACKGROUND

With the increased popularity of wireless communications such as fifth-generation (5G) communications and subsequent sixth-generation (6G) communications and beyond, there is a growing demand for increased flexibility and efficiency in using the communication bandwidth by wireless devices, including reducing non-linearities associated with signal processing in transceiver systems.

BRIEF DESCRIPTION OF THE DRAWINGS

In the drawings, like numerals may describe the same or similar components or features in different views. Like numerals having different letter suffixes may represent different instances of similar components. Some embodiments are illustrated by way of example, and not limitation, in the figures of the accompanying drawings in which.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

In some embodiments, a digital-time converter (DTC) (also referred to as a DTC circuit) can be used as a phase modulator in transceiver systems. For example, a DTC command (which can be a DTC code) is associated with a specific phase and is used to modulate an input signal (e.g., a local oscillator signal, or LO signal) based on the specific phase. The DTC circuit, however, is an analog device with associated nonlinearity, which can be an impairment in transceiver systems, including a polar digital transmitter (DTX) system. In some embodiments, a loop-back (LPBK) receiver circuit can be used to calibrate the DTC nonlinearity. A down-converted signal in the loop back receiver averages the phase of the RF signal and, therefore, the rising and falling edges at the DTC output. In some aspects, if the rise and fall nonlinearity (e.g., nonlinearity associated with a rising edge signal portion and a falling edge signal portion) differ from one another, there is increased energy in 2×LO or 1/2 and 3/2 LO harmonics if a doubler is used at the DTC output. This increased unwanted energy might violate the regulatory requirements which will call for transmitter (TX) power decrease to meet such requirements.

The disclosed techniques include a DTC calibration circuit configured to capture the rise and fall nonlinearity separately via the same LPBK receiver circuit, to allow pre-distortion of the DTC codes separately (e.g., use separate DTC codes for the rising edge signal portion and the falling edge signal portion) and decrease the unwanted spurs to a lower level. Additional functionalities of the DTC calibration circuit are discussed in connection with at least FIGS. 1, 2, and 5-8.

Figure 1:
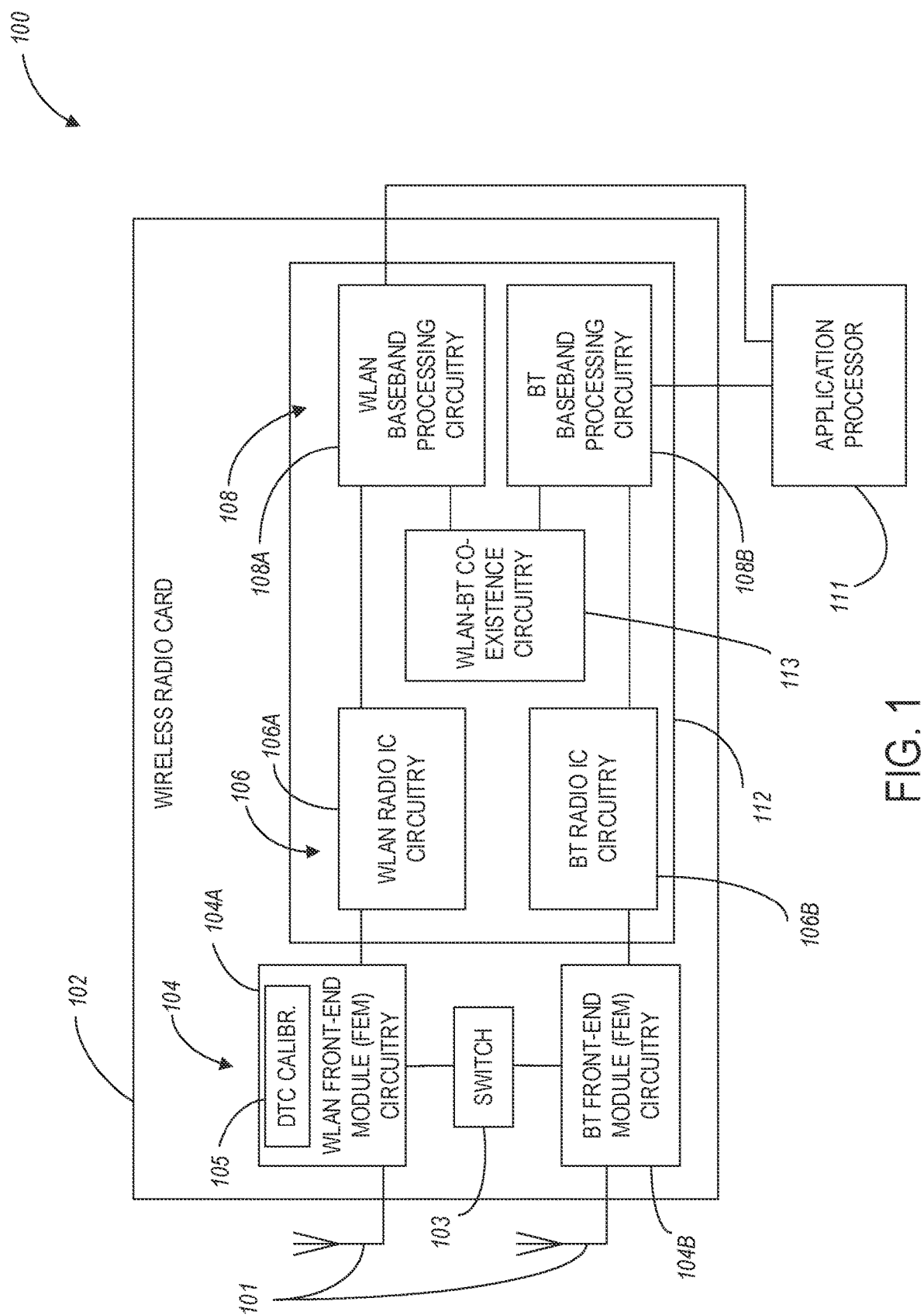
FIG. 1 is a block diagram of a radio architecture with a DTC calibration circuit, in accordance with some embodiments.

FIG. 1 is a block diagram of a radio architecture 100 with a DTC calibration circuit, in accordance with some embodiments. The radio architecture 100 may be implemented in a computing device (e.g., device 900 in FIG. 9) including user equipment (UE), a base station (e.g., a next generation Node-B (gNB), enhanced Node-B (eNB)), a smartphone, or another type of wired or wireless device. The radio architecture 100 may include radio front-end module (FEM) circuitry 104, radio integrated circuit (IC) circuitry 106, and baseband processing circuitry 108. Radio architecture 100 as shown includes both Wireless Local Area Network (WLAN) functionality and Bluetooth (BT) functionality although embodiments are not so limited and the disclosed techniques apply to other types of radio architectures as well. In this disclosure, "WLAN" and "Wi-Fi" are used interchangeably. In some aspects, a single wireless functionality can be configured (e.g., one of WLAN, BT, or another type of wires functionality).

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals, and to provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals and to provide the amplified versions of the received signals to the BT radio IC circuitry 106B for further processing. The FEM circuitry 104A may also include a transmit signal path which may include circuitry configured to amplify WLAN signals provided by the radio IC circuitry 106A for wireless transmission by the one or more antennas 101. Besides, the FEM circuitry 104B may also include a transmit signal path which may include circuitry configured to amplify BT signals provided by the radio IC circuitry 106B for wireless transmission by the one or more antennas. In the embodiment of FIG. 1, although FEM circuitry 104A and FEM circuitry 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Figure 2:
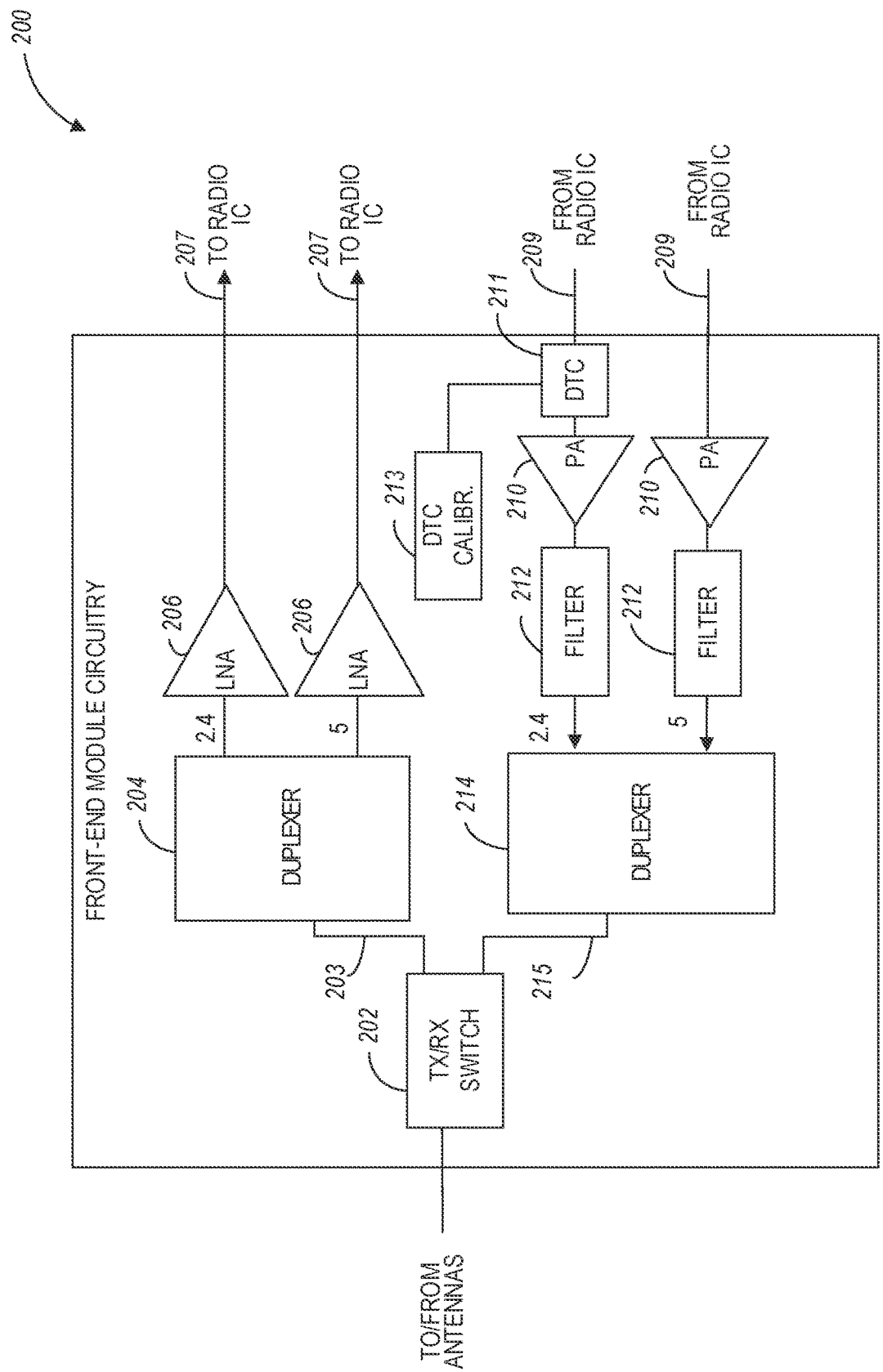
FIG. 2 illustrates a front-end module circuitry for use in the radio architecture of FIG. 1, in accordance with some embodiments.
Figure 5:
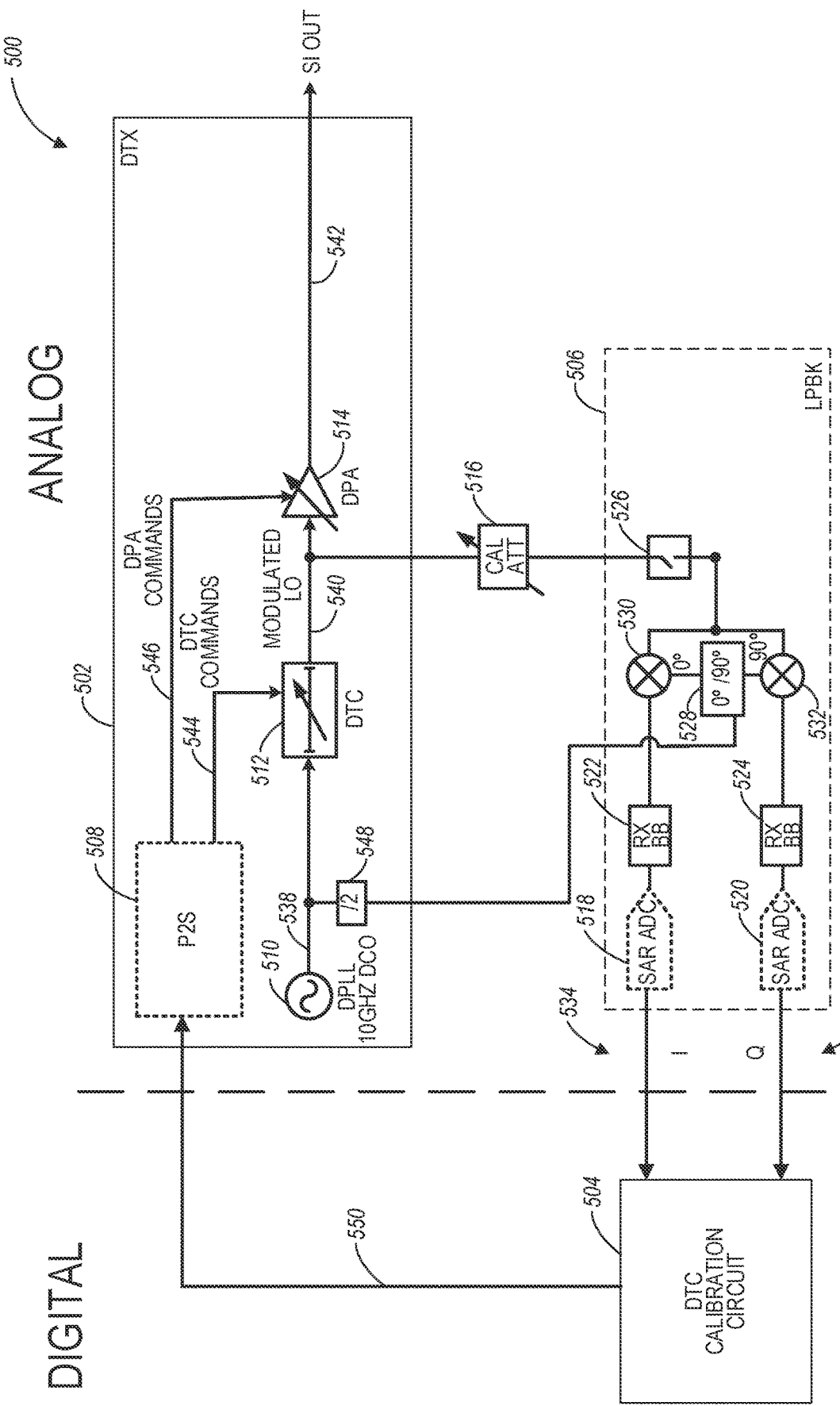
FIG. 5 illustrates a block diagram of signal processing circuitry including a digital transmitter (DTX) using a DTC calibration circuit, in accordance with some embodiments.

In some embodiments, FEM circuitry 104 (e.g., one or both of FEM circuitries 104A and 104B) include a DTC calibration circuit 105, which can be the same as the DTC calibration circuit 213 of FIG. 2 or the DTC calibration circuit 504 of FIG. 5. In some embodiments, the DTC calibration circuit can be configured to generate DTC commands (e.g., DTC codes) to trigger the DTC in such a sequence that will enable mathematically to separate the nonlinearity of the DTC rising edges from the nonlinearity of the falling edges. As used herein, the terms "nonlinearity" and "integral nonlinearity (INL)" are used interchangeably. By determining INL nonlinearity (also referred to as INL error) associated with the rising and falling edges, the corresponding DTC commands can be adjusted to compensate for the nonlinearity in the DTC circuit output. The functionality of the DTC calibration circuit is discussed in greater detail in connection with FIGS. 5-8.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the FEM circuitry 104A and provide baseband signals to WLAN baseband processing circuitry 108A. The BT radio IC circuitry 106B may, in turn, include a receive signal path which may include circuitry to down-convert BT RF signals received from the FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include physical layer (PHY) and medium access control layer (MAC) circuitry and may further interface with the application processor 111 for generation and processing of the baseband signals and for controlling operations of the radio IC circuitry 106.

Referring still to FIG. 1, according to the shown embodiment, WLAN-BT coexistence circuitry 113 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of the one or more antennas 101 as between the WLAN and BT FEMs, or the provision of more than one antenna connected to each of FEM 104A or 104B.

In some embodiments, the front-end module circuitry 104, the radio IC circuitry 106, and the baseband processing circuitry 108 may be provided on a single radio card, such as wireless radio card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or IC, such as IC 112.

In some embodiments, the wireless radio card 102 may include a WLAN radio card and may be configured for Wi-Fi communications, although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers. In some embodiments, the wireless radio card 102 may include a platform controller hub (PCH) system-on-a-chip (SOC) and a central processing unit (CPU)/host SOC.

In some of these multicarrier embodiments, radio architecture 100 may be part of a Wi-Fi communication station (STA) such as a wireless access point (AP), a base station, or a mobile device including a Wi-Fi enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.1 lac, IEEE 802.11-2016, and/or 802.1 lax standards and/or proposed specifications for WLANs, although the scope of embodiments is not limited in this respect. Radio architecture 100 may also be suitable to transmit and/or receive communications in accordance with other techniques and standards, including a $3^{rd}$ Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.11ax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the single wireless radio card 102, although embodiments are not so limited, and include within their scope discrete WLAN and BT radio cards In some embodiments, the radio architecture 100 may include other radio cards, such as a cellular radio card configured for cellular (e.g., 3GPP such as LTE, LTE-Advanced, or 5G communications).

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. In some aspects, a diplexer may be used in place of a TX/RX switch. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) 210 to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 in FIG. 1).

In some dual-mode embodiments for Wi-Fi communication, the FEM circuitry 200 may be configured to operate in, e.g., either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a PA 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications.

In some embodiments, the input RF signals 209 can be phase-modulated by the DTC circuit 211 before being amplified by PA 210. In some embodiments, nonlinearities of the DTC circuit 211 can be calibrated by the DTC calibration circuit 213 using the disclosed techniques.

Figure 3:
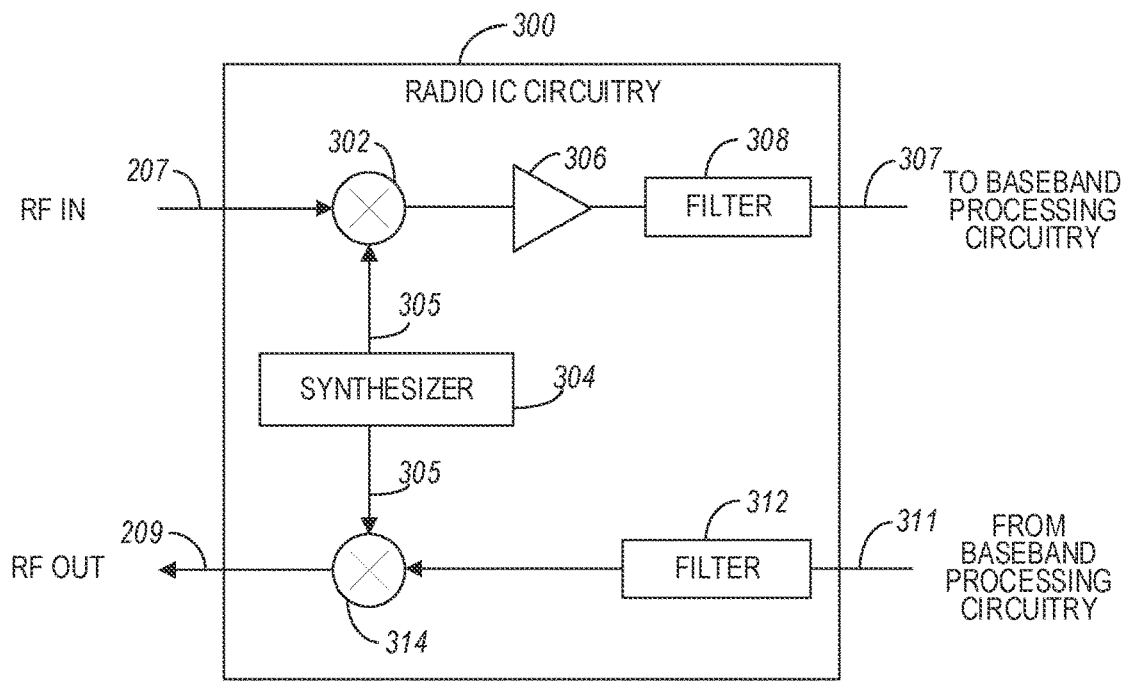
FIG. 3 illustrates a radio IC circuitry for use in the radio architecture of FIG. 1, in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry 308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 302 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate input RF signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as synthesized frequency 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (FIG. 3) or to filter circuitry 308 (FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage-controlled oscillator (VCO), although that is not a requirement. A divider control input may further be provided by either the baseband processing circuitry 108 (FIG. 1) or the application processor 111 (FIG. 1) depending on the desired output frequency 305. In some embodiments, a divider control input (e.g., N) may be determined from a look-up table (e.g., within a Wi-Fi card) based on a channel number and a channel center frequency as determined or indicated by the application processor 111.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
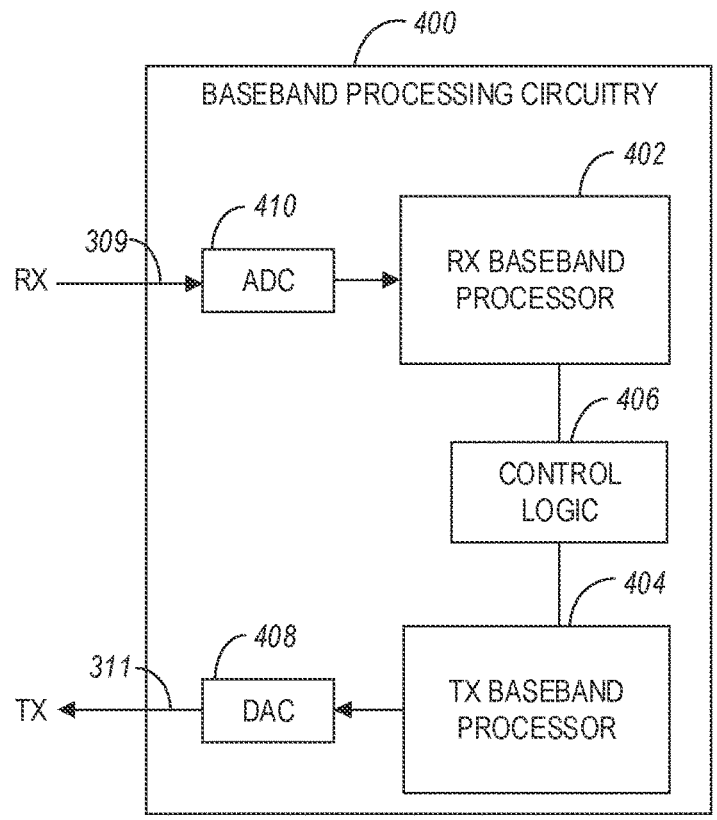
FIG. 4 illustrates a baseband processing circuitry for use in the radio architecture of FIG. 1, in accordance with some embodiments.

FIG. 4 illustrates a functional block diagram of baseband processing circuitry 400 in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing received analog baseband signals 309 provided by the radio IC circuitry 106 (FIG. 1) and a transmit baseband processor (TX BBP) 404 for generating analog input baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include an analog-to-digital converter (ADC) 410 to convert analog baseband signals 309 received from the radio IC circuitry 106 to digital baseband signals for processing by the RX BBP 402. In these embodiments, the baseband processing circuitry 400 may also include a digital-to-analog converter (DAC) 408 to convert digital baseband signals from the TX BBP 404 to analog input baseband signals 311.

In some embodiments that communicate OFDM signals or OFDMA signals, such as through the WBPC 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the one or more antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

FIG. 5 illustrates a block diagram of signal processing circuitry 500 including a digital transmitter (DTX) 502 using a DTC calibration circuit 504, in accordance with some embodiments. Referring to FIG. 5, the DTX 502 includes a parallel-to-serial (P2S) synchronization circuit 508, a digitally controlled oscillator (DCO) 510, DTC circuit 512, and a digital power amplifier (DPA) 514. The DCO 510 is configured to generate an LO signal 538 communicated as input to DTC circuit 512. The DTC circuit 512 is configured to receive at least one DTC command 544 from the P2S synchronization circuit 508, and phase modulates the LO signal 538 based on the DTC command 544 to generate a modulated LO signal 540. The modulated LO signal 540 is amplified by DPA 514 based on at least one DPA command 546 received from the P2S synchronization circuit 508, to generate a phase-modulated and amplitude-modulated output signal 542.

The P2S synchronization circuit 508 is configured to synchronize the output of the at least one DTC command 544 and the at least one DPA command 546 to the DTC circuit 512 and the DPA 514 respectively.

In an example embodiment, the signal processing circuitry 500 further includes a DTC calibration circuit 504 configured to perform calibration on the DTC commands used by the DTC circuit 512 to compensate for integral nonlinearities (INL) of the DTC circuit 512 (e.g., INL associated with a falling edge signal portion and a raising edge signal portion of a phase-modulated signal output of the DTC circuit 512). More specifically, the signal processing circuitry 500 includes a loopback (LPBK) circuit 506 configured to generate a digital signal representing the modulated LO signal 540.

The LPBK circuit 506 includes attenuation circuit 516, a switch 526, a synthesizer 528, mixers 530 and 532, baseband signal processing circuits 522 and 524, and ADCs 518 and 520. In operation, the LO signal 538 can be divided by divider 548 (e.g., when the LO signal 538 is 10 GHz and a 5 GHz LO signal is desired) and is communicated as input to synthesizer 528. The modulated LO signal 540 is sampled via switch 526 and attenuation circuit 516. The attenuated and modulated LO signal is mixed by mixers 530 and 532 with phase-offset signals generated by synthesizer 528, and the resulting phase offset signals are converted to baseband signals by the baseband signal processing circuits 522 and 524. The baseband signals are then digitized by ADCs 518 and 520 to generate in-phase (I) component signal 534 and quadrature (Q) component signal 536 corresponding to the modulated LO signal 540. The I component signal 534 and the Q component signal 536 are communicated as inputs to the DTC calibration circuit 504 for analysis and determining an INL error associated with rising and falling edges of the modulated LO signal 540. The DTC calibration circuit 504 generates a compensation signal 550 to adjust one or more of the DTC codes used as DTC commands 544.

Even though FIG. 5 illustrates signal processing circuitry 500 as including the DTX 502, the LPBK circuit 506, and the DTC calibration circuit 504 as separate circuits, the disclosure is not limited in this regard and such circuits can be implemented as single or multiple circuits.

Figure 6:
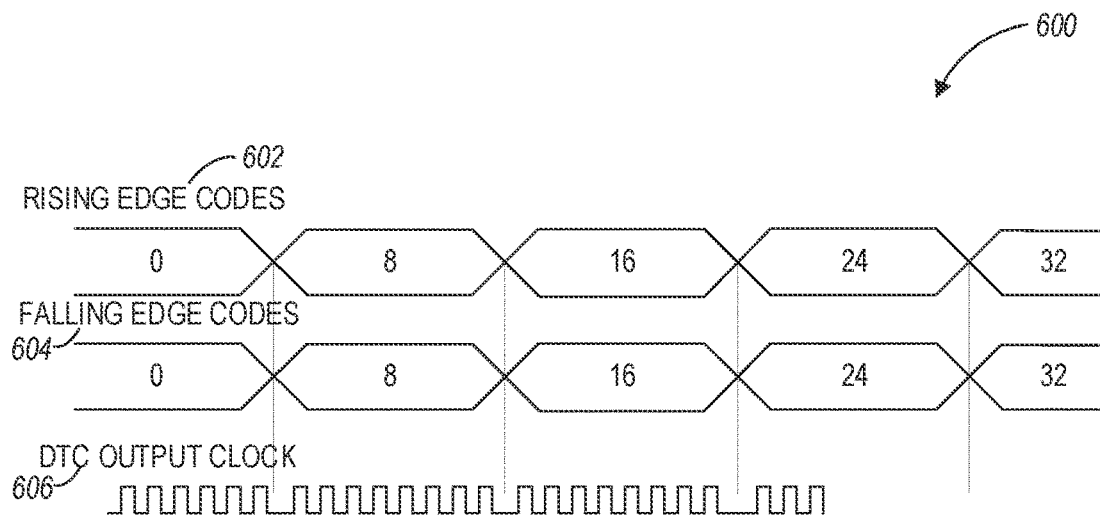
FIG. 6 illustrates phase and phase error timing diagrams based on a DTC circuit applying the same DTC codes on both the rising and falling edge signal portions, in accordance with some embodiments.
Figure 6:
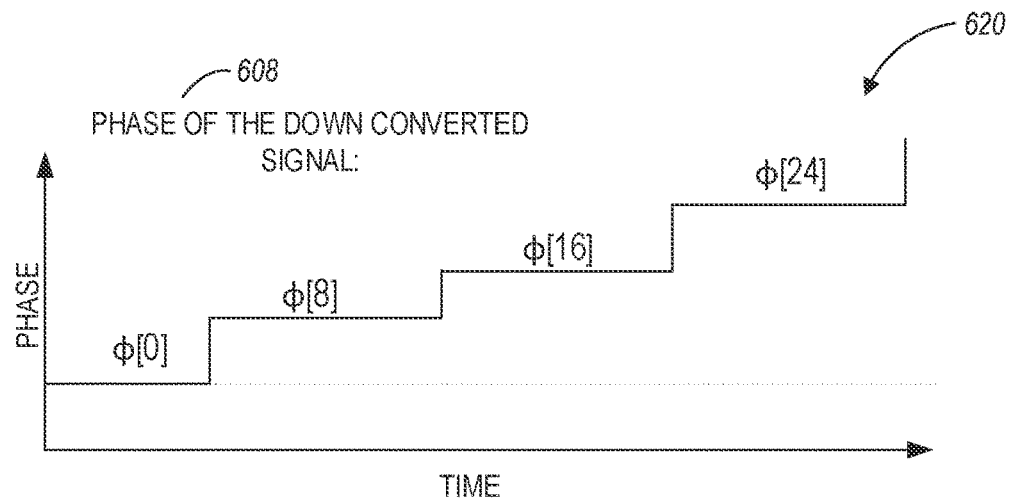
Figure 6:
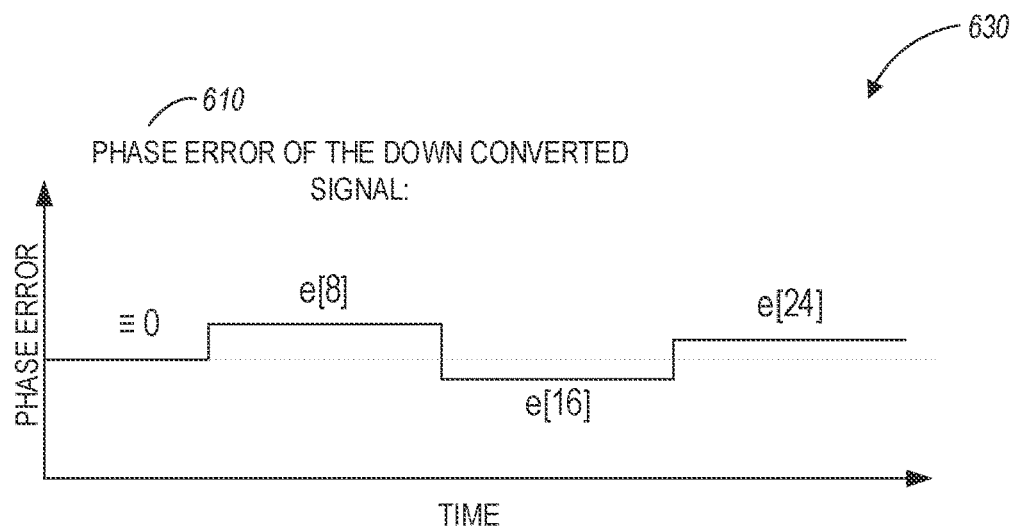

In some aspects, the DTC predistortion used by the DTC calibration circuit 504 creates a staircase DTC code sequence that moves both rising and falling edges at the DTC output. The down-converted signal at the input of the LPBK circuit 506 detects the phase of the DTC output (e.g., modulated LO signal 540) and compares it to the phase at DTC code "0". FIG. 6 illustrates an example use case based on a DTC code jump of 8, where the same DTC codes on both the rising and falling edge signal portions.

FIG. 6 illustrates phase and phase error timing diagrams based on a DTC circuit applying the same DTC codes on both the rising and falling edge signal portions, in accordance with some embodiments. Referring to FIG. 6, diagram 600 illustrates example DTC code applications by the DTC circuit for rising and falling edges of the LO signal. For example, diagram 600 illustrates an application of the same DTC codes of 0, 8, 16, 24, and 32 as rising edge codes 602 as well as falling edge codes 604, collectively associated with the DTC output clock signal 606.

FIG. 6 further illustrates a timing diagram 620 of corresponding signal phases 608 of the phase-modulated LO signal at the output of the DTC circuit 512, corresponding to the DTC codes illustrated in diagram 600. Timing diagram 630 illustrates the phase error 610 (also referred to as INL error) for each signal cycle, where a single signal cycle includes the application of a DTC code for a raising edge signal portion and a falling edge signal portion (e.g., application of corresponding raising edge codes 602 and falling edge codes 604 in a single signal cycle). For example and about diagram 600, a single signal cycle includes application of DTC codes 0-0 (as rising and falling edge DTC codes respectively), 8-8, 16-16, etc. In this regard, timing diagram 630 illustrates the INL error for the first application of DTC codes 0-0 as the baseline INL error (equaling 0), and each subsequent phase error (e.g., indicated as e[8] associated with using DTC codes of 8-8 for rising and falling edges, e[16] associated with using DTC codes of 16-16 for rising and falling edges, etc.) is determined in relation to the baseline INL error.

In an example embodiment, the DTC calibration circuit 504 can determine the INL errors for each DTC code and adjust the DTC code for a subsequent application by the DTC circuit 512 based on the determined INL errors.

In some embodiments, the technique of FIG. 6 can be used if the nonlinearity of the rising edges and the falling edges are the same. Since the down-converted phase contains the average information from both edges (e.g., total INL error e[c] can be expressed as e[c]=($e_{rise}$[c]+$e_{fall}$[c])/2, where $e_{rise}$ and $e_{fall}$ are the INL errors for the rising and falling edges respectively. If the nonlinearity in both the rising and falling edges differs, correcting for the average of the INL errors may not be sufficient since each edge divergence from the average contributes to spectral impurity, which might violate regulatory demands.

In some embodiments, the DTC circuit 512 can be configured to use a different DTC code sequence than illustrated in FIG. 6, which can allow for differentiation of the INL errors for the rising and falling edges. In this regard, DTC codes can be adjusted individually for each rising and falling edge during phase modulation by the DTC circuit 512. In some embodiments, the DTC code sequence can be based on mixing values of rising and falling DTC codes in a patterned way (e.g., as illustrated in FIG. 7), which allows for separation (e.g., using mathematical techniques discussed below) to separate the phase contributed from the rising and falling edges.

Figure 7:
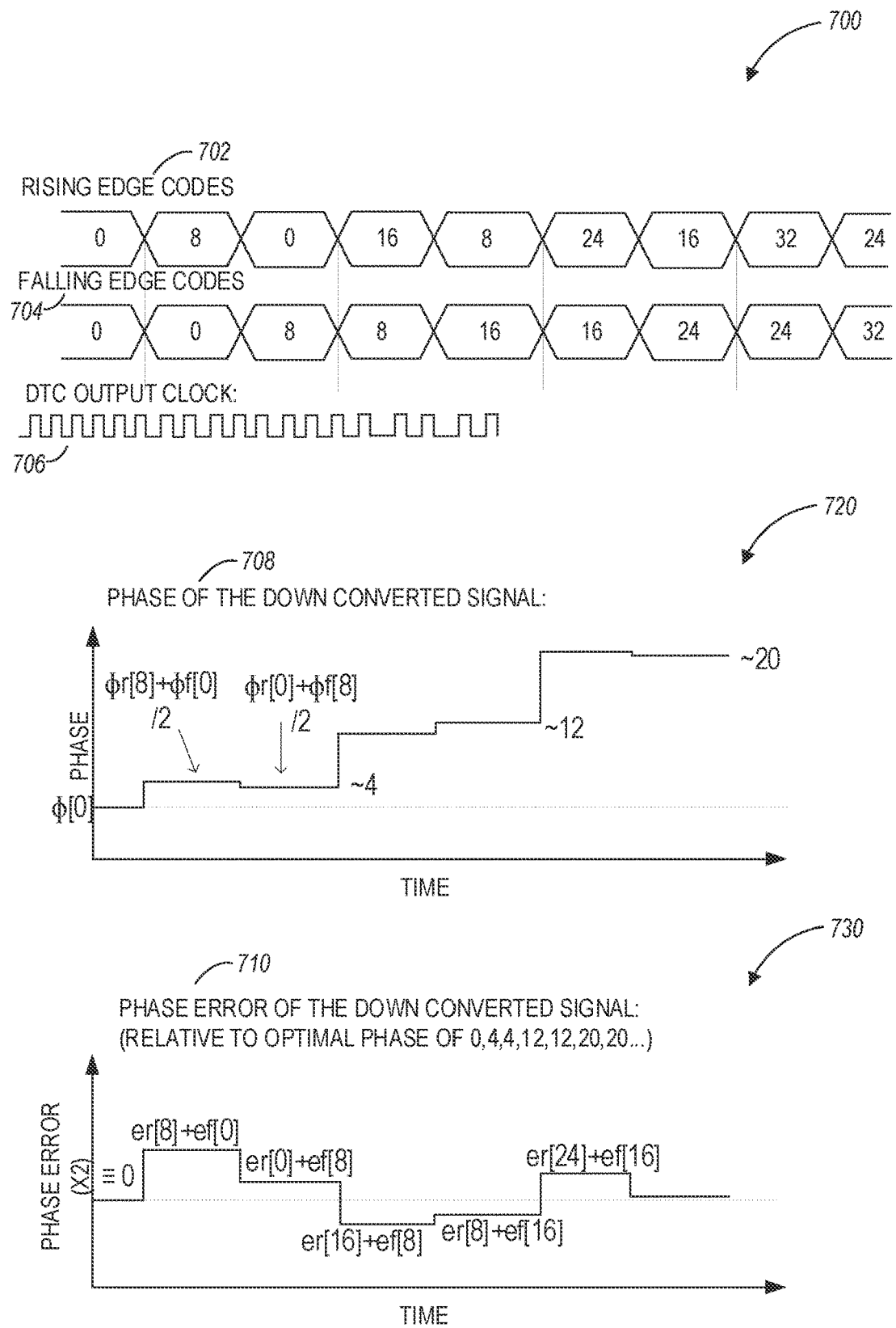
FIG. 7 illustrates phase and phase error timing diagrams based on a DTC circuit toggling the DTC codes on the rising and falling edge signal portions, in accordance with some embodiments.

FIG. 7 illustrates phase and phase error timing diagrams based on a DTC circuit toggling the DTC codes on the rising and falling edge signal portions, in accordance with some embodiments. Referring to FIG. 7, diagram 700 illustrates an example DTC code application by the DTC circuit for rising and falling edges of the LO signal. For example, diagram 700 illustrates an application of DTC codes in a toggled pattern for the rising edge DTC codes 702 and the falling edge DTC codes 704 (e.g., the first application of DTC codes 0-0 for rising and falling edges, followed by toggled DTC codes of 8-0, 0-8, 16-8, 8-16, 24-16, 16-24, 32-24, 24-32, etc.), collectively associated with the DTC output clock signal 706.

FIG. 7 further illustrates a timing diagram 720 of corresponding signal phases 708 of the phase-modulated LO signal at the output of the DTC circuit 512, corresponding to the toggled DTC codes illustrated in diagram 700. The signal phase for a given signal cycle (e.g., based on the application of a single rising edge DTC code and a single falling edge DTC code) is the average of the phases associated with the rising and falling edge signal portions.

Timing diagram 730 illustrates the phase error 710 (also referred to as INL error) for each signal cycle, where a single signal cycle includes the application of a DTC code for a raising edge signal portion and a falling edge signal portion (e.g., application of corresponding raising edge codes 702 and falling edge codes 704 in a single signal cycle). For example and about diagram 700, a single signal cycle includes application of DTC codes 0-0 (as rising and falling edge DTC codes respectively), 8-0, 0-8, 16-8, 8-16, etc. In this regard, timing diagram 730 illustrates the INL error for the first application of DTC codes 0-0 as the baseline INL error (equaling 0), and each subsequent phase error (e.g., a subsequent error is indicated as er[8]+ef[0] associated with using DTC code 8 as the rising edge code and DTC code 0 as the falling edge code, etc.) is determined in relation to the baseline INL error.

In some aspects, instead of changing both rise and fall phases at the same time (e.g., as illustrated in FIG. 6), such phases can be toggled (e.g., as illustrated in FIG. 7, via using different DTC codes as rising and falling edge DTC codes). This allows the DTC calibration circuit 504 to observe the phase errors (e.g., INL errors) separately. In some aspects, it can be assumed that the low-pass effect of the LPBK circuit 506 causes the baseband phase to be the average of the rising and falling phases (after the phase converges from the previous code jump).

In some aspects, the following techniques may be used by the DTC calibration circuit 504 in determining the individual INL errors of rising and falling edges for purposes of adjusting individual DTC codes used for such rising and falling edges.

In some embodiments, each DTC code results with a specific phase ($\phi$[c]) which is different for rising edge signal portions ($\phi_r$[c]) and falling edge signal portions ($\phi_f$[c]). This phase can be written as the optimal phase (in units of codes, it will simply be "c") and an INL error which can be determined for DTC code adjustment is ($\phi_r$[c]=c+$e_r$[c]).

For each combination of rising edge DTC code i and falling edge DTC code j, the observed average phase is $$\left(\phi_{i,j} \triangleq \frac{\phi_r[i]}{2} + \frac{\phi_f[j]}{2}\right).$$

After removing the optimal phase, the following equation for the average phase is determined:

$$\phi_{i,j} - \frac{i+j}{2} = \frac{e_r[i]}{2} + \frac{e_f[j]}{2} \triangleq \frac{a_{i,j}}{2}.$$

In some embodiments, it can be assumed that $e_r[0] \triangleq e_f[0]$. The toggling shown in FIG. 7 can be used for expressing the following equations (where $\alpha_{x,y}$ is the resulting INL error from adding the individual INL errors associated with a corresponding rising edge signal portion and a falling edge signal portion, and C is the last DTC code):

$$e_r[0] + e_f[0] = a_{0,0}$$

-continued $$e_r[8] + e_f[0] = a_{8,0}$$
$$e_r[0] + e_f[8] = a_{0,8}$$
$$e_r[16] + e_f[8] = a_{0,8}$$
$$e_r[8] + e_f[16] = a_{16,8}$$
$$\vdots$$
$$e_r[C] + e_f[C-8] = a_{C,C-8}$$
$$e_r[C-8] + e_f[C] = a_{C-8,C}$$

Since phase is relative, all equations can be defined to phase ϕ[0].
There are $$\frac{C}{4} + 2$$

equations and $$\frac{C}{4} + 2$$

parameters, so the above equations can be written in matrix form as follows:

$$\underbrace{\begin{bmatrix} 1 & -1 & 0 & 0 & 0 & \cdots & 0 \\ 1 & 1 & 0 & 0 & 0 & \cdots & 0 \\ 0 & 1 & 1 & 0 & 0 & \cdots & 0 \\ 1 & 0 & 0 & 1 & 0 & \cdots & 0 \\ 0 & 0 & 0 & \cdots & \cdots & \cdots & 0 \\ \vdots & \vdots & \vdots & \vdots & \vdots & \vdots & \vdots \\ 0 & 0 & 0 & 0 & 1 & 1 & 0 \\ 0 & 0 & 0 & 0 & \cdots & 0 & 1 \end{bmatrix}}_{M} \cdot \underbrace{\begin{bmatrix} e_r[0] \\ e_f[0] \\ e_r[8] \\ e_f[8] \\ \vdots \\ e_r[C] \\ e_f[C] \end{bmatrix}}_{e} = \underbrace{\begin{bmatrix} 0 \\ a_{0,0} \\ a_{8,0} \\ a_{0,8} \\ \vdots \\ a_{C,C-8} \\ a_{C-8,C} \end{bmatrix}}_{a}.$$

From the above equation, a full rank matrix $$\frac{C}{4} + 2$$

is achieved, which can be solved by inverting matrix M, to obtain the following equation for the INL error matrix.
$\hat{e} = (M^T \cdot M)^{-1} \cdot M^T \cdot \alpha$.

In this regard, the DTC calibration circuit 504 can use the in-phase (I) component signal 534 and quadrature (Q) component signal 536 for multiple phase-modulated LO signals output by the DTC circuit 512 (e.g., for all or a subset of the available DTC codes, such as a subset of DTC codes used for a full period of phase modulations), determine the resulting INL errors, and then determine the individual INL errors for each rising and falling edge cycle. The individual INL errors can be used to configure individual compensations/adjustments (e.g., via compensation signal 550) to be applied by the DTC circuit 512 for corresponding rising and falling signal edges.

In some embodiments, the above described "toggling approach" can be implemented with different code-jumps and different code sequences (as long as the rise and fall are toggled separately and there are as many (or more) equations as un-known parameters). In some aspects, accuracy can be improved by running multiple types of sequences and code jumps and estimating the parameters from all of them combined (e.g., by using a least-square algorithm). In some aspects, accuracy can be improved by running this calibration iteratively (each time implementing pre-distortion and estimating the residual INL).

In some embodiments, an apparatus of a communication device (e.g., device 900) includes a digitally controlled oscillator (e.g., DCO 510) configured to generate a local oscillator (LO) signal (e.g., LO signal 538). The device further includes a DTC circuit (e.g., DTC circuit 512) configured to perform phase modulation of the LO signal to generate a phase-modulated LO signal (e.g., phase-modulated LO signal 540). To perform the phase modulation, the DTC circuit is to detect a rising edge signal portion and a falling edge signal portion associated with the LO signal, apply a first DTC code of a plurality of DTC codes to the rising edge signal portion, and apply a second DTC code of the plurality of DTC codes to the falling edge signal portion. The plurality of DTC codes corresponds to a plurality of phases associated with the phase modulation. The device further includes a calibration circuit configured to determine nonlinearities associated with the rising edge signal portion and the falling edge signal portion, and adjust at least one of the first DTC code and the second DTC code based on the nonlinearities.

In some embodiments, the DTC circuit 512 is configured to generate a plurality of phase-modulated LO signals using a subset of the plurality of DTC codes, the subset causing signal phase shifts of the LO signal corresponding to a full period.

In some embodiments, the device includes an LPBK circuit 506 configured to sample the plurality of phase-modulated LO signals and generate a plurality of digital baseband signals corresponding to the sampled plurality of phase-modulated LO signals.

In some embodiments, the DTC calibration circuit 504 is to determine a plurality of resulting integral non-linearity (INL) errors corresponding to the plurality of digital baseband signals. Each resulting INL error of the plurality of resulting INL errors for a corresponding digital baseband signal of the plurality of digital baseband signals is a sum of INL errors. The INL errors are associated with a rising edge signal portion and a falling edge signal portion of a corresponding one of the plurality of phase-modulated LO signals.

In some embodiments, the DTC calibration circuit 504 is to determine the INL errors for each of the plurality of resulting INL errors based on a matrix associated with usage of the subset of the plurality of DTC codes to generate the plurality of phase-modulated LO signals.

In some aspects, the DTC calibration circuit 504 is to retrieve an INL error of the determined INL errors for each of the plurality of resulting INL errors based on a phase of the plurality of phases corresponding to the first DTC code and the second DTC code. The DTC calibration circuit 504 is to adjust at least one of the first DTC code and the second DTC code based on the retrieved INL error.

In some aspects, the DTC circuit 512 is to generate the phase-modulated LO signal based on the first DTC code being equal to the second DTC code. To generate a subsequent phase-modulated LO signal, the DTC circuit 512 is to select the first DTC code to be different from the second DTC code and toggle usage of the first DTC code and the second DTC code to generate the subsequent phase-modulated LO signal.

Figure 8:
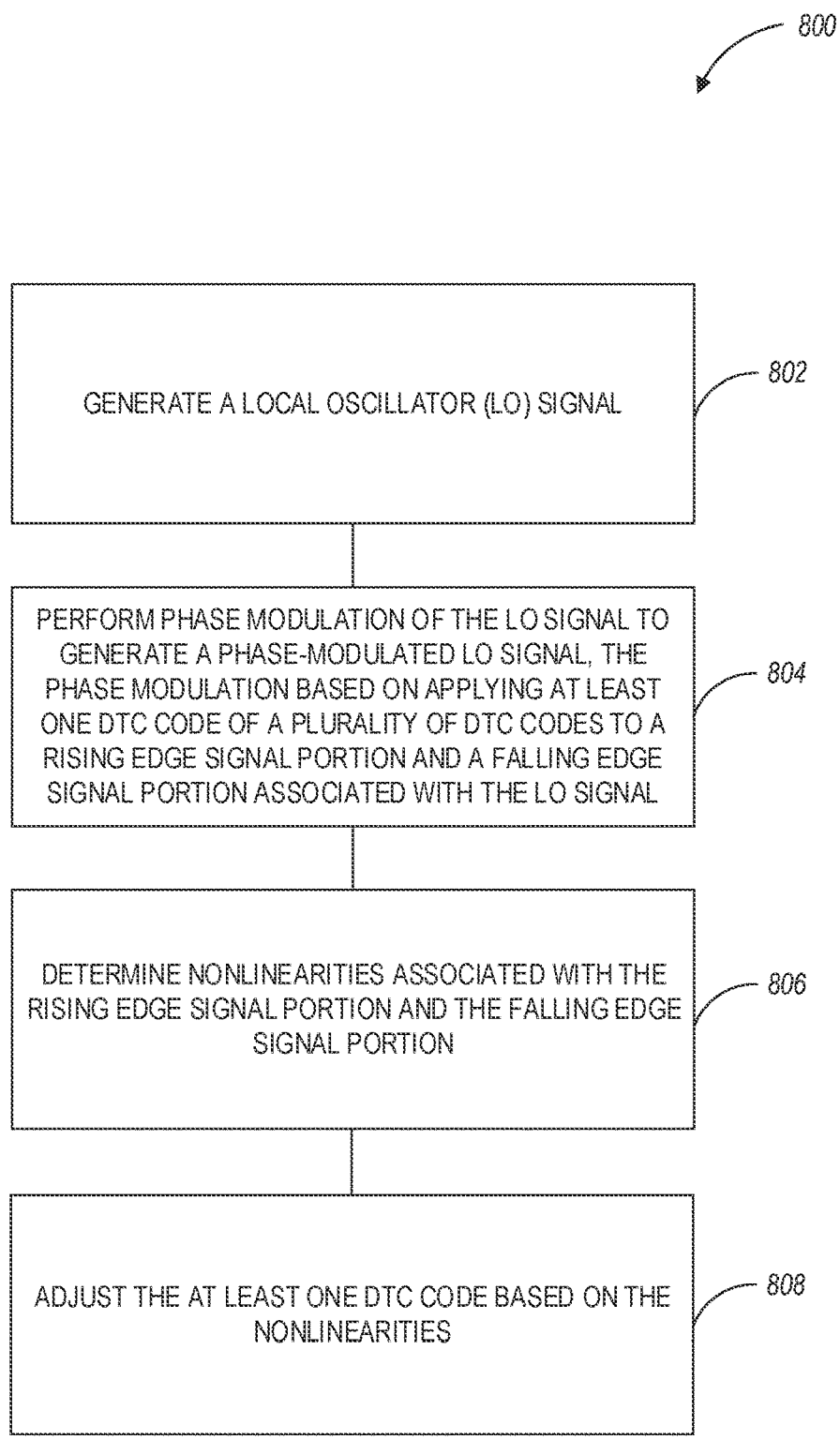
FIG. 8 illustrates a flow diagram of a method for compensating signal nonlinearities, in accordance with some embodiments.

FIG. 8 illustrates a flow diagram of a method 800 for compensating signal nonlinearities, in accordance with some embodiments. Referring to FIG. 8, method 800 includes operations 802, 804, 806, and 808, which may be executed by the DTC calibration circuit 504 or another circuit of a wireless device (e.g., hardware processor 902 of machine 900 illustrated in FIG. 9 or circuitry of the signal processing circuitry 500 of FIG. 5).

At operation 802, an LO signal is generated. For example, DCO 510 generates LO signal; 538.

At operation 804, phase modulation of the LO signal is performed to generate a phase-modulated LO signal. For example, the DTC circuit 512 performs the phase modulation to generate the phase-modulated LO signal 540. The phase modulation is based on applying at least one DTC code (e.g., based on the at least one DTC command 544) of a plurality of DTC codes to a rising edge signal portion and a falling edge signal portion associated with the LO signal.

At operation 806, nonlinearities associated with the rising edge signal portion and the falling edge signal portion are determined (e.g., by the DTC calibration circuit 504).

At operation 808, the at least one DTC code is adjusted based on the nonlinearities. For example, the DTC calibration circuit 504 performs the disclosed techniques to determine individual INL errors associated with the rising and falling edge signal portions and generates a compensation signal 550 to adjust corresponding DTC codes before phase modulation by the DTC circuit 512.

In some embodiments, performing the phase-modulation includes detecting the rising edge signal portion and the falling edge signal portion associated with the LO signal, applying a first DTC code of the plurality of DTC codes to the rising edge signal portion, and applying a second DTC code of the plurality of DTC codes to the falling edge signal portion. The plurality of DTC codes corresponds to a plurality of phases associated with the phase modulation.

In some embodiments, a plurality of phase-modulated LO signals is generated using a subset of the plurality of DTC codes, the subset causing signal phase shifts of the LO signal corresponding to a full period.

In some aspects, the plurality of phase-modulated LO signals are sampled (e.g., via the LPBK circuit 506), and a plurality of digital baseband signals are generated (e.g., at the output of ADCs 518 and 520) corresponding to the sampled plurality of phase-modulated LO signals.

In some embodiments, a plurality of resulting integral nonlinearity (INL) errors corresponding to the plurality of digital baseband signals are determined. Each resulting NL error of the plurality of resulting INL errors for a corresponding digital baseband signal of the plurality of digital baseband signals is a sum of INL errors. The INL errors are associated with a rising edge signal portion and a falling edge signal portion of a corresponding one of the plurality of phase-modulated LO signals.

In some embodiments, the INL errors are determined for each of the plurality of resulting INL errors based on a matrix associated with usage of the subset of the plurality of DTC codes to generate the plurality of phase-modulated LO signals.

In some embodiments, an INL error of the determined INL errors is retrieved for each of the plurality of resulting INL errors based on a phase of the plurality of phases corresponding to the subset. The DTC code is adjusted based on the retrieved INL error.

In some aspects, the phase-modulated LO signal is generated based on the first DTC code being equal to the second DTC code.

In some embodiments, a subsequent phase-modulated LO signal is generated. The generating of the subsequent phase-modulated LO signal includes selecting the first DTC code to be different from the second DTC code, and toggling usage of the first DTC code and the second DTC code to generate the subsequent phase-modulated LO signal.

Figure 9:
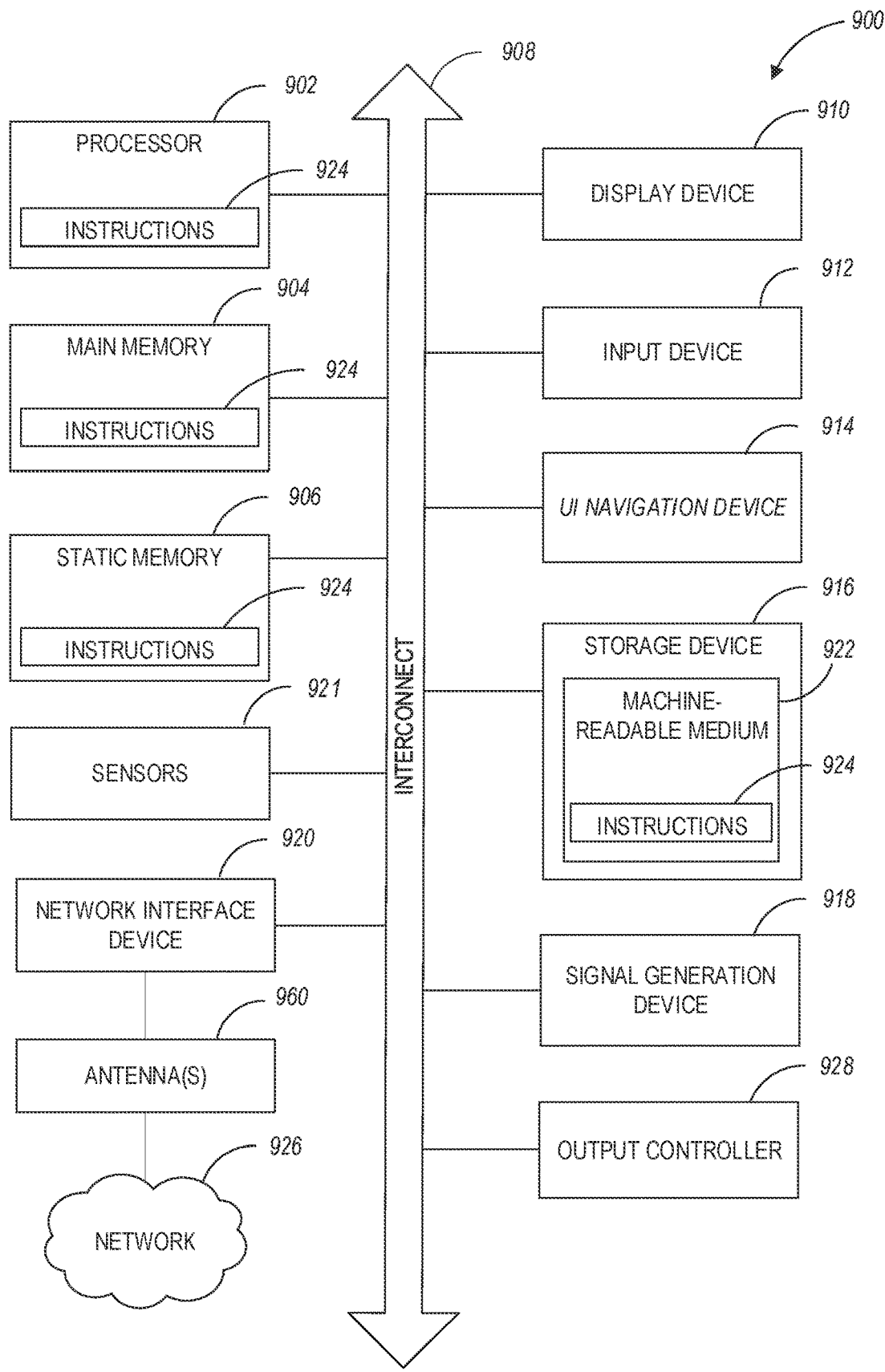
FIG. 9 illustrates a block diagram of an example machine upon which any one or more of the operations/techniques (e.g., methodologies) discussed herein may perform.

FIG. 9 illustrates a block diagram of an example machine 900 upon which any one or more of the techniques (e.g., methodologies) discussed herein may perform. In alternative embodiments, the machine 900 may operate as a standalone device or may be connected (e.g., networked) to other machines. In a networked deployment, machine 900 may operate in the capacity of a server machine, a client machine, or both in server-client network environments. In an example, the machine 900 may act as a peer machine in a peer-to-peer (P2P) (or other distributed) network environment. The machine 900 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 900 may include a hardware processor 902 (e.g., a central processing unit (CPU), a graphics processing unit (GPU), a hardware processor core, or any combination thereof), a main memory 904, and a static memory 906, some or all of which may communicate with each other via an interlink (e.g., bus) 908.

Specific examples of main memory 904 include Random Access Memory (RAM), and semiconductor memory devices, which may include, in some embodiments, storage locations in semiconductors such as registers. Specific examples of static memory 906 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM; and CD-ROM and DVD-ROM disks.

Machine 900 may further include a display device 910, an input device 912 (e.g., a keyboard), and a user interface (UI) navigation device 914 (e.g., a mouse). In an example, the display device 910, input device 912, and UI navigation device 914 may be a touch screen display. The machine 900 may additionally include a storage device (e.g., drive unit or another mass storage device) 916, a signal generation device 918 (e.g., a speaker), a network interface device 920, and one or more sensors 921, such as a global positioning system (GPS) sensor, compass, accelerometer, or other sensors. The machine 900 may include an output controller 928, such as a serial (e.g., universal serial bus (USB), parallel, or other wired or wireless (e.g., infrared(IR), near field communication (NFC), etc.) connection to communicate or control one or more peripheral devices (e.g., a printer, card reader, etc.). In some embodiments, the processor 902 and/or instructions 924 may comprise processing circuitry and/or transceiver circuitry.

The storage device 916 may include a machine-readable medium 922 on which is stored one or more sets of data structures or instructions 924 (e.g., software) embodying or utilized by any one or more of the techniques or functions described herein. The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 916 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 922 is illustrated as a single medium, the term "machine-readable medium" may include a single medium or multiple media (e.g., a centralized or distributed database, and/or associated caches and servers) configured to store one or more instructions 924.

An apparatus of the machine 900 may be one or more of a hardware processor 902 (e.g., a central processing unit (CPU), a graphics processing unit (GPU), a hardware processor core, or any combination thereof), a main memory 904 and a static memory 906, one or more sensors 921, a network interface device 920, antennas 960, a display device 910, an input device 912, a UI navigation device 914, a storage device 916, instructions 924, a signal generation device 918, and an output controller 928. The apparatus may be configured to perform one or more of the methods and/or operations disclosed herein. The apparatus may be intended as a component of the machine 900 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 924 may further be transmitted or received over a communications network 926 using a transmission medium via the network interface device 920 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi@, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others.

In an example, the network interface device 920 may include one or more physical jacks (e.g., Ethernet, coaxial, or phone jacks) or one or more antennas to connect to the communications network 926. In an example, the network interface device 920 may include one or more antennas 960 to wirelessly communicate using at least one single-input multiple-output (SIMO), multiple-input multiple-output (MIMO), or multiple-input single-output (MISO) techniques. In some examples, the network interface device 920 may wirelessly communicate using Multiple User MIMO techniques. The term "transmission medium" shall be taken to include any intangible medium that is capable of storing, encoding, or carrying instructions for execution by the machine 900, and includes digital or analog communications signals or other intangible media to facilitate communication of such software.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect.

Antennas referred to herein may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to 1/10 of a wavelength or more.

Described implementations of the subject matter can include one or more features, alone or in combination as illustrated below by way of examples.

Example 1 is an apparatus of a communication device, the apparatus comprising: a digital-to-time converter (DTC) circuit to perform phase modulation of a local oscillator (LO) signal to generate a phase-modulated LO signal. To perform the phase modulation, the DTC circuit is to detect a rising edge signal portion and a falling edge signal portion associated with the LO signal, apply a first DTC code of a plurality of DTC codes to the rising edge signal portion, and apply a second DTC code of the plurality of DTC codes to the falling edge signal portion, the plurality of DTC codes corresponding to a plurality of phases associated with the phase modulation. The apparatus comprises a calibration circuit to adjust at least one of the first DTC code and the second DTC code based on the nonlinearities associated with the rising edge signal portion and the falling edge signal portion.

In Example 2, the subject matter of Example 1 includes subject matter where the DTC circuit is configured to generate a plurality of phase-modulated LO signals using a subset of the plurality of DTC codes, the subset causing signal phase-shifts of the LO signal corresponding to a full period.

In Example 3, the subject matter of Example 2 includes, a loop-back circuit configured to sample the plurality of phase-modulated LO signals; and generate a plurality of digital baseband signals corresponding to the sampled plurality of phase-modulated LO signals.

In Example 4, the subject matter of Example 3 includes subject matter where the calibration circuit is to: determine a plurality of resulting integral non-linearity (INL) errors corresponding to the plurality of digital baseband signals.

In Example 5, the subject matter of Example 4 includes subject matter where each resulting INL error of the plurality of resulting INL errors for a corresponding digital baseband signal of the plurality of digital baseband signals is a sum of INL errors, wherein the INL errors are associated with a rising edge signal portion and a falling edge signal portion of a corresponding one of the plurality of phase-modulated LO signals.

In Example 6, the subject matter of Example 5 includes subject matter where the calibration circuit is to: determine the INL errors for each of the plurality of resulting INL errors based on a matrix associated with usage of the subset of the plurality of DTC codes to generate the plurality of phase-modulated LO signals.

In Example 7, the subject matter of Example 6 includes subject matter where the calibration circuit is to: retrieve an INL error of the determined INL errors for each of the plurality of resulting INL errors based on a phase of the plurality of phases corresponding to the first DTC code and the second DTC code; and adjust the at least one of the first DTC code and the second DTC code based on the retrieved INL error.

In Example 8, the subject matter of Examples 1-7 includes subject matter where the DTC circuit is to: generate the phase-modulated LO signal based on the first DTC code being equal to the second DTC code.

In Example 9, the subject matter of Example 8 includes subject matter where to generate a subsequent phase-modulated LO signal, the DTC circuit is to: select the first DTC code to be different from the second DTC code; and toggle usage of the first DTC code and the second DTC code to generate the subsequent phase-modulated LO signal.

Example 10 is a method for compensating signal nonlinearities, the method comprising: generating a local oscillator (LO) signal; performing phase modulation of the LO signal to generate a phase-modulated LO signal, the phase modulation based on applying at least one digital-to-time converter (DTC) code of a plurality of DTC codes to a rising edge signal portion and a falling edge signal portion associated with the LO signal; determining nonlinearities associated with the rising edge signal portion and the falling edge signal portion: and adjusting the at least one DTC code based on the nonlinearities.

In Example 11, the subject matter of Example 10 includes subject matter where performing the phase-modulation comprises: detecting the rising edge signal portion and the falling edge signal portion associated with the LO signal; applying a first DTC code of the plurality of DTC codes to the rising edge signal portion; and applying a second DTC code of the plurality of DTC codes to the falling edge signal portion, the plurality of DTC codes corresponding to a plurality of phases associated with the phase modulation.

In Example 12, the subject matter of Examples 10-11 includes, generating a plurality of phase-modulated LO signals using a subset of the plurality of DTC codes, the subset causing signal phase shifts of the LO signal corresponding to a full period.

In Example 13, the subject matter of Example 12 includes, sampling the plurality of phase-modulated LO signals; and generating a plurality of digital baseband signals corresponding to the sampled plurality of phase-modulated LO signals.

In Example 14, the subject matter of Example 13 includes, determining a plurality of resulting integral nonlinearity (INL) errors corresponding to the plurality of digital baseband signals; wherein each resulting INL error of the plurality of resulting INL errors for a corresponding digital baseband signal of the plurality of digital baseband signals is a sum of INL errors; and wherein the INL errors are associated with a rising edge signal portion and a falling edge signal portion of a corresponding one of the plurality of phase-modulated LO signals.

In Example 15, the subject matter of Example 14 includes, determining the INL errors for each of the plurality of resulting NL errors based on a matrix associated with usage of the subset of the plurality of DTC codes to generate the plurality of phase-modulated LO signals.

In Example 16, the subject matter of Example 15 includes, retrieving an INL error of the determined INL errors for each of the plurality of resulting INL errors based on a phase of the plurality of phases corresponding to the subset; and adjusting the DTC code based on the retrieved INL error.

In Example 17, the subject matter of Examples 11-16 includes, generating the phase-modulated LO signal based on the first DTC code being equal to the second DTC code.

In Example 18, the subject matter of Example 17 includes, generating a subsequent phase-modulated LO signal, the generating of the subsequent phase-modulated LO signal comprising: selecting the first DTC code to be different from the second DTC code; and toggling usage of the first DTC code and the second DTC code to generate the subsequent phase-modulated LO signal.

Example 19 is at least one non-transitory machine-readable storage medium comprising instructions stored thereupon, which when executed by processing circuitry of a wireless device, cause the processing circuitry to perform operations comprising: generating a local oscillator (LO) signal; performing phase modulation of the LO signal to generate a phase-modulated LO signal, the phase modulation based on applying at least one digital-to-time converter (DTC) code of a plurality of DTC codes to a rising edge signal portion and a falling edge signal portion associated with the LO signal; determining nonlinearities associated with the rising edge signal portion and the falling edge signal portion; and adjusting the at least one DTC code based on the nonlinearities.

In Example 20, the subject matter of Example 19 includes subject matter where the processing circuitry is further configured to perform operations comprising: detecting the rising edge signal portion and the falling edge signal portion associated with the LO signal; applying a first DTC code of the plurality of DTC codes to the rising edge signal portion; and applying a second DTC code of the plurality of DTC codes to the falling edge signal portion, the plurality of DTC codes corresponding to a plurality of phases associated with the phase modulation.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined regarding the appended claims, along with the full scope of equivalents to which such claims are entitled.

What is claimed is:

1. An apparatus for a communication device, the apparatus comprising:
   a digital-to-time converter (DTC) circuit to perform phase modulation of a local oscillator (LO) signal to generate a phase-modulated LO signal, wherein to perform the phase modulation, the DTC circuit is to:
   detect a rising edge signal portion and a falling edge signal portion associated with the LO signal;
   apply a first DTC code of a plurality of DTC codes to the rising edge signal portion;
   apply a second DTC code of the plurality of DTC codes to the falling edge signal portion, the plurality of DTC codes corresponding to a plurality of phases associated with the phase modulation; and
generate a plurality of additional phase-modulated LO signals using a subset of the plurality of DTC codes; and
a calibration circuit, the calibration circuit to:
adjust at least one of the first DTC code and the second DTC code based on nonlinearities associated with the rising edge signal portion and the falling edge signal portion.

2. The apparatus of claim 1, wherein the subset causes signal phase shifts of the LO signal corresponding to a full period.

3. The apparatus of claim 2, further comprising:
a loop-back circuit configured to:
sample the plurality of additional phase-modulated LO signals; and
generate a plurality of digital baseband signals corresponding to the sampled plurality of additional phase-modulated LO signals.

4. The apparatus of claim 3, wherein the calibration circuit is to:
determine a plurality of resulting integral non-linearity (INL) errors corresponding to the plurality of digital baseband signals.

5. The apparatus of claim 4, wherein each resulting INL error of the plurality of resulting INL errors for a corresponding digital baseband signal of the plurality of digital baseband signals is a sum of INL errors,
wherein the INL errors are associated with a rising edge signal portion and a falling edge signal portion of a corresponding one of the plurality of additional phase-modulated LO signals.

6. The apparatus of claim 5, wherein the calibration circuit is to:
determine the INL errors for each of the plurality of resulting INL errors based on a matrix associated with usage of the subset of the plurality of DTC codes to generate the plurality of phase-modulated LO signals.

7. The apparatus of claim 6, wherein the calibration circuit is to:
retrieve an INL error of the determined INL errors for each of the plurality of resulting INL errors based on a phase of the plurality of phases corresponding to the first DTC code and the second DTC code; and
adjust the at least one of the first DTC code and the second DTC code based on the retrieved INL error.

8. The apparatus of claim 1, further comprising a power amplifier, wherein the DTC circuit adjusts the at least one of the first DTC code and the second DTC code prior to signal amplification by the power amplifier, and wherein the DTC circuit is to:
generate the phase-modulated LO signal based on the first DTC code being equal to the second DTC code.

9. The apparatus of claim 8, wherein to generate a subsequent phase-modulated LO signal, the DTC circuit is to:
select the first DTC code to be different from the second DTC code; and
toggle usage of the first DTC code and the second DTC code to generate the subsequent phase-modulated LO signal.

10. A method for compensating signal nonlinearities, the method comprising:
generating a local oscillator (LO) signal;
performing phase modulation of the LO signal to generate a phase-modulated LO signal, the phase modulation based on applying at least one digital-to-time converter (DTC) code of a plurality of DTC codes to a rising edge signal portion and a falling edge signal portion associated with the LO signal;
determining nonlinearities associated with the rising edge signal portion and the falling edge signal portion;
adjusting the at least one DTC code based on the nonlinearities; and
generating a plurality of additional phase-modulated LO signals using a subset of the plurality of DTC codes.

11. The method of claim 10, wherein performing the phase-modulation comprises:
detecting the rising edge signal portion and the falling edge signal portion associated with the LO signal;
applying a first DTC code of the plurality of DTC codes to the rising edge signal portion; and
applying a second DTC code of the plurality of DTC codes to the falling edge signal portion, the plurality of DTC codes corresponding to a plurality of phases associated with the phase modulation.

12. The method of claim 11, further comprising:
generating the phase-modulated LO signal based on the first DTC code being equal to the second DTC code.

13. The method of claim 12, further comprising:
generating a subsequent phase-modulated LO signal, the generating of the subsequent phase-modulated LO signal comprising:
selecting the first DTC code to be different from the second DTC code; and
toggling usage of the first DTC code and the second DTC code to generate the subsequent phase-modulated LO signal.

14. The method of claim 10, wherein the subset causes signal phase shifts of the LO signal corresponding to a full period.

15. The method of claim 14, further comprising:
sampling the plurality of additional phase-modulated LO signals; and
generating a plurality of digital baseband signals corresponding to the sampled plurality of additional phase-modulated LO signals.

16. The method of claim 15, further comprising:
determining a plurality of resulting integral non-linearity (INL) errors corresponding to the plurality of digital baseband signals;
wherein each resulting INL error of the plurality of resulting INL errors for a corresponding digital baseband signal of the plurality of digital baseband signals is a sum of INL errors; and
wherein the INL errors are associated with a rising edge signal portion and a falling edge signal portion of a corresponding one of the plurality of additional phase-modulated LO signals.

17. The method of claim 16, further comprising:
determining the INL errors for each of the plurality of resulting INL errors based on a matrix associated with usage of the subset of the plurality of DTC codes to generate the plurality of additional phase-modulated LO signals.

18. The method of claim 17, further comprising:
retrieving an INL error of the determined INL errors for each of the plurality of resulting INL errors based on a phase of the plurality of phases corresponding to the subset; and
adjusting the DTC code based on the retrieved INL error.

19. At least one non-transitory machine-readable storage medium comprising instructions stored thereupon, which when executed by processing circuitry of a wireless device, cause the processing circuitry to perform operations comprising:

generating a local oscillator (LO) signal;

performing phase modulation of the LO signal to generate a phase-modulated LO signal, the phase modulation based on applying at least one digital-to-time converter (DTC) code of a plurality of DTC codes to a rising edge signal portion and a falling edge signal portion associated with the LO signal;

determining nonlinearities associated with the rising edge signal portion and the falling edge signal portion;

adjusting the at least one DTC code based on the nonlinearities; and generating a plurality of additional phase-modulated LO signals using a subset of the plurality of DTC codes.

20. The at least one non-transitory machine-readable storage medium of claim 19, wherein the processing circuitry is further configured to perform operations comprising:

detecting the rising edge signal portion and the falling edge signal portion associated with the LO signal;

applying a first DTC code of the plurality of DTC codes to the rising edge signal portion; and applying a second DTC code of the plurality of DTC codes to the falling edge signal portion, the plurality of DTC codes corresponding to a plurality of phases associated with the phase modulation.

\* \* \* \* \*